United States Patent [19]

Tickle

[11] 4,420,497

[45] Dec. 13, 1983

[54] METHOD OF DETECTING AND REPAIRING LATENT DEFECTS IN A SEMICONDUCTOR DIELECTRIC LAYER

[75] Inventor: Andrew C. Tickle, Los Altos, Calif.

[73] Assignee: Fairchild Camera and Instrument Corporation, Mountain View, Calif.

[21] Appl. No.: 295,417

[22] Filed: Aug. 24, 1981

[51] Int. Cl.$^3$ .................. B05D 5/12; H01L 21/00
[52] U.S. Cl. .......................... 427/8; 29/574; 29/575; 427/93; 427/94; 427/140
[58] Field of Search ............... 427/8, 82, 93, 94, 140; 29/574, 575

[56] References Cited

U.S. PATENT DOCUMENTS 3,874,915  4/1975  Ono et al. ................ 427/94
4,302,725  11/1981  Nubani ...................... 29/574

Primary Examiner—Paul J. Thibodeau
Attorney, Agent, or Firm—Kenneth Olsen; Carl L. Silverman; Alan H. MacPherson

[57] ABSTRACT

Defects in dielectric layers exhibiting low dielectric strength on silicon substrates (11) are deliberately damaged during manufacture to allow their repair by the formation of dielectric plugs (13B). The defects are damaged by the application of an electric field, and are repaired by the selective oxidation or nitridation of the silicon substrate underlying the damaged areas of dielectrics.

14 Claims, 3 Drawing Figures

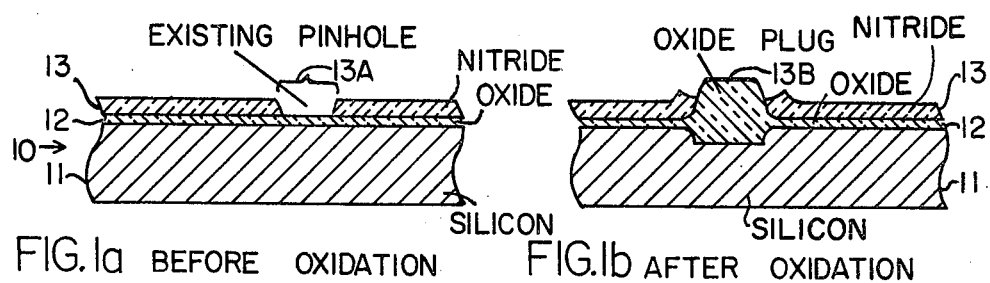
FIG. 1a BEFORE OXIDATION   FIG. 1b AFTER OXIDATION
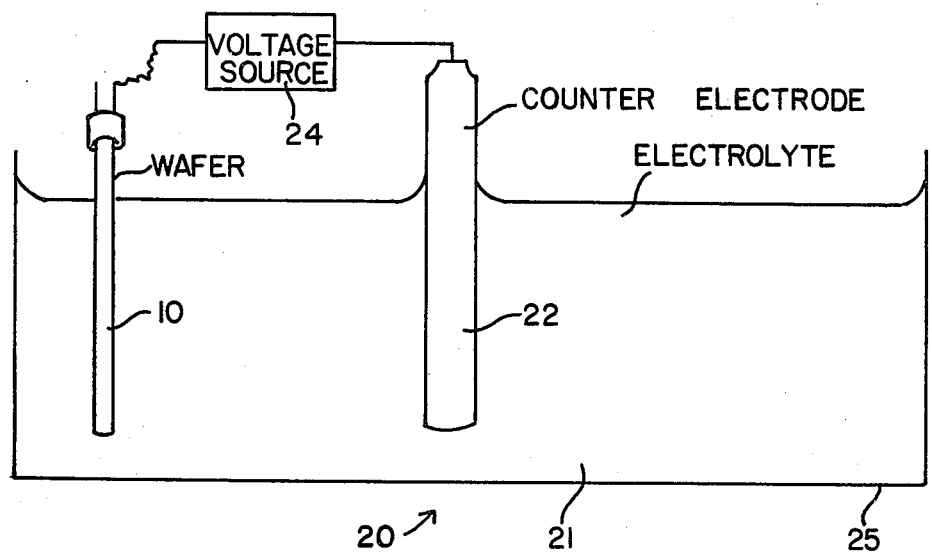
FIG. 2   APPARATUS FOR DAMAGING LATENT DEFECTS

METHOD OF DETECTING AND REPAIRING LATENT DEFECTS IN A SEMICONDUCTOR DIELECTRIC LAYER

BACKGROUND OF THE INVENTION

1. Field of the Invention

This invention relates to the manufacture of semiconductor devices and particularly to a method for locating and repairing latent pinholes, cracks and microscopic areas of low breakdown voltage in dielectric layers prior to completion of the devices.

2. Prior Art

The detection and elimination of pinholes in dielectric materials used in the manufacture of semiconductor devices is crucial to maximizing device yield and minimizing device cost. A number of techniques have been suggested for at least partially eliminating pinholes. One technique, which recognizes that defects in masks which might cause pinholes have a higher probability of falling over the field of the device than over the active areas of the device, forms thick oxide over the field of the device. As a result, pinholes are unlikely to form through the thick field oxide. A second technique forms at least two different dielectric layers in sequence, one layer directly adjacent the other, so that a pinhole in one dielectric layer is highly probable of being covered by a non-pinholed region of the other dielectric layer.

In a silicon oxide-silicon nitride two-layer dielectric the self-healing of existing pinholes in the silicon nitride layer by a subsequent oxidation is well known. This prior art technique relies on the fact that the oxidation rate of silicon nitride is extremely slow compared to that of silicon and works only when the pinhole in the silicon nitride extends through the nitride to the silicon oxide. However, when latent defects are present in an oxide-nitride layer such that the nitride film is continuous throughout the defective region but thinner than desired, or the oxide underlying the nitride has a pinhole or is thinner than desired, or is defective due to contamination, or the nitride overlying the oxide has a defect due to contamination, or any combination of these defects, the prior art method does not work since the underlying substrate is not exposed and the oxidation rate of the nitride itself is extremely small. Such latent defects as described above often cause local low breakdown voltages and sometimes cause a total malfunction of part of an integrated circuit, or a leakage sufficient to prevent meeting required test and reliability specifications. As devices become smaller, such low breakdown voltages will have a greater likelihood of adversely impacting device performance. For example, channel contamination, particulate contamination, thin regions and protrusions due to precipitates in the substrate all locally enhance the electric field and thus can cause abnormal performance where the adjacent dielectric is thinner than designed.

The prior art has no method of detecting and correcting for the above described latent defects prior to completion of the circuit. This invention provides a remedy for these defects which is both easily implemented and relatively effective.

SUMMARY OF THE INVENTION

This invention approaches the problem of eliminating pinholes in dielectric layers from a different point-of-view. In accordance with this invention, latent pinholes, cracks and microscopic areas of low breakdown in a dielectric layer or layers are deliberately damaged during manufacture so that any such latent defect can be located and then repaired by the formation of additional dielectric material within the damaged area.

In accordance with this invention, a voltage is applied across the dielectric to stress areas of latent defects (i.e. "weak areas") so as to damage or modify these areas (hereinafter these weak areas as well as unintended open areas in the dielectric are generally referred to as "pinholes"). The applied voltages are close to but less than the maximum value which the dielectric is capable of withstanding in the product, so that the applied voltage will not damage normal dielectric regions. The electrical stress is applied across the dielectric by electrically contacting the semiconductor substrate in the wafer on which the dielectric is formed and then immersing the wafer in an electrolyte (which, in some embodiments, can contain a wetting agent) which intimately contacts the dielectric surfaces. An electrode is immersed in the electrolyte, thus providing a complete electrical circuit from the substrate, through the electrolyte, to the immersed electrode. Weak areas of the dielectric are damaged or modified by this electrical stress to expose the underlying silicon or silicon oxide. Dielectric plugs can then be formed by oxidizing the underlying silicon substrate through the defects to repair the defects, thus resulting in a dielectric layer free from defects and weak areas.

While it is known from the prior art to use a bubble tester for counting pinholes formed in a dielectric surface due to electrolysis in those regions of the dielectric thinner than normal, this prior art technique is an analytical procedure and is not a method of both damaging and then repairing latent pinholes in the breakdown areas.

This invention will be more fully understood in conjunction with the following detailed description taken together with the drawings.

DESCRIPTION OF THE DRAWINGS

FIGS. 1A and 1B illustrate in cross section a semiconductor wafer containing thereon a layer of silicon oxide on which is formed a layer of silicon nitride with an existing pinhole (shown schematically), and an oxide plug formed in the existing pinhole, respectively, in accordance with this invention.

FIG. 2 illustrates schematically the structure for damaging latent defects in a dielectric layer or layers on a semiconductor wafer in accordance with this invention.

DETAILED DESCRIPTION

The following description is by way of illustration only and is not intended to limit the scope of the claims. Other embodiments of this invention will be obvious to those skilled in the art in view of this disclosure.

FIG. 1A illustrates a semiconductor wafer 10 comprising a substrate 11 of silicon upon which is formed a silicon oxide layer 12 (typically by thermal oxidation in a well-known manner) and upon which is then formed a silicon nitride layer 13. Nitride layer 13 is likewise formed in a well-known manner and thus the formation of both oxide layer 12 and nitride layer 13 will not be described in any detail.

A pinhole 13A is shown formed in a portion of the surface of nitride layer 13. Typically pinhole 13A is formed due to a defect in the mask or the presence of an impurity on the oxide. Of importance, the pinhole 13A of FIG. 1A may be totally devoid of any oxide 12 and any nitride 13, or may comprise a thickness of oxide 12 and of nitride 13 which results in pinhole 13A having a dielectric strength less than that required during the operation of the finished device. For example, pinhole 13A may be totally devoid of oxide 12, and comprise the desired thickness of nitride 13, or may be devoid of nitride 13 and comprise the desired thickness of oxide 12, or comprise a combination of two thinner than planned portions of oxide 12 and nitride 13. In any event, the result is a pinhole having insufficient dielectric strength as shown schematically in FIG. 1A. Such a pinhole will be repaired in accordance with this invention, by forming an oxide plug 13B (FIG. 1B) in the pinhole thereby effectively eliminating the pinhole defect in the dielectric layer comprising oxide 12 and nitride 13.

In accordance with this invention, the wafer 10, after the formation of oxide 12 and nitride 13, is placed in an electrolyte 21 in a container 25 as illustrated in FIG. 2. Wafer 10 is submerged in the electrolyte 21 and an electrical voltage source is connected from the wafer to a counter-electrode 22 placed in electrolyte 21. Electrolyte 21 may comprise any dilute acid except acids which attack or corrode the materials on the semiconductor wafer, namely silicon nitride, silicon oxide and silicon. Thus, a number of different electrolytes (such as acetic acid) may be used in the practice of this invention. Electrolyte 21 should preferably not contain sodium in order to prevent undesirable contamination of wafer 10. Electrolyte 21 may also include a wetting agent, which prevents bubbles from forming and adhering to wafer 10 and provides good contact between electrolyte 21 and wafer 10. A typical wetting agent comprises FC 95 manufactured by 3M. Counterelectrode 22 may comprise a noble metal electrode such as one made of platinum.

Voltage source 24 is connected to wafer 23 and the counter electrode 22 is then activated to provide a voltage across the dielectric between wafer 10 and electrode 22. The voltage is raised to a level (typically 15–16 volts) just below the maximum value of the voltage which the dielectric is capable of withstanding in the product. Thus the voltage will not damage the normal dielectric regions of the product. Electrical contact to substrate 11 is made in a well known manner by use of a clip. Electrolyte 21 intimately contacts the surfaces of wafer 10 and the surfaces of dielectric layers 12 and 13 exposed to the electrolyte. If desired, electrolyte 21 can be ultrasonically agitated to aid in the removal of any bubbles formed by electrolysis. In addition, alternating current or pulsed direct current can be derived from source 24, thus generating electric fields of alternating or pulsed polarity within the electrolyte. These limit polarization in the electrolyte. The application of a steady state field to the electrolyte results in a separation (i.e. a "polarization") of the positive and negative ions in the electrolyte which causes these ions to "pile up" in separate regions of the electrolyte. This partially neutralizes the electric field and reduces the amount of control over the process.

The voltage applied across wafer 10 to electrode 22 locally ruptures the dielectric in locations where the dielectric is sufficiently weak due to pinholes or other anomalies, by locally exceeding the dielectric breakdown strength (typically approximately $10^7$ volts per centimeter of oxide and nitride thickness) and thus modifying or loosening the bond structure so that oxygen will penetrate any pinhole in the dielectric during a subsequent oxidation step and form a self-healing oxide plug.

The length of time during which the wafer 10 is placed in electolyte 21 and subjected to the voltage provided by voltage source 24 may vary anywhere from a few seconds to several hours depending on several factors. Many defects in semiconductor isolation layers exhibit a phenomenon best described as "time dependent breakdown", wherein such defects may not completely fail unless subjected to a voltage for a relatively long period of time. Thus, if the wafer 10 is placed in the electrolyte and a voltage applied between the wafer 10 and the counter-electrode 22, numerous pinholes will rupture within seconds, and a decreasing number of additional pinholes will rupture over a rather lengthy period of time. Thus, the voltage of voltage source 24, and the length of time during which the wafer 10 is subjected to the voltage source 24 are preferably selected such that the voltage of voltage source 24 is greater than the voltage which the insulation layer must experience during actual operation of a finished device. The time during which the wafer 10 is subjected to the voltage source 24 is adjusted empirically in order to cause breakdown of the dielectric layer at weak points, including the time dependant weaknesses which may fail during the useful life of the finished device.

Following the application of the voltage (typically 15–16 volts for a 600–700 angstrom thick oxide layer on which is formed a 600–700 angstrom thick nitride layer), wafer 10 is removed from electrolyte 21, rinsed in deionized water and then placed in an oxidizing furnace where it is again reoxidized for a selected time. For example, in order to form an oxide plug of approximately seven hundred angstroms thickness, the wafer is reoxidized by subjecting the wafer to a five minute ramp up in dry oxygen to approximately 920° C., followed by 18 minutes in steam plus 2–3% HCl (which serves as a getter for sodium and heavy metals) at approximately 920° C., followed by approximately 15 minutes in dry nitrogen gas at approximately 920° C., followed by an approximately 5 minute ramp down to room temperature. Of course, other process parameters may be utilized for this oxidation step. The exact thickness of the oxide plug is somewhat dependant on the thickness of the oxide within the pinhole prior to the reoxidation, because as is well known, the growth rate of silicon dioxide is parabolic as a function of time, with the growth rate of silicon dioxide decreasing as its thickness increases.

The reoxidation results in the formation of an oxide plug, such as oxide plug 13B shown in FIG. 1B. The nitride 13 over the surface of the device prevents any substantial oxidation of the silicon wafer beneath the nitride during this process, thus maintaining a dielectric layer of relatively uniform thickness. Accordingly, only those regions of the dielectric which have potential defects due to pinholes or dust are reoxidized, thereby preventing these regions from degrading the performance of the device due to short circuits when the device is completed, while maintaining a substantially uniform dielectric thickness over the entire remaining surface of the wafer. Thus, this method allows the identification and repair of latent pinholes in low breakdown areas.

This method is also useful in repairing thermal nitride formed by direct nitridation. Silicon nitride may be formed by direct nitridation of ammonia (having a free nitrogen radical) at high temperature, or by utilizing nitrogen gas in a plasma, with the plasma serving to separate the two nitrogen atoms which are linked in each nitrogen molecule. The resultant film formed directly on a silicon substrate is self-limiting in growth at approximately 70 Å in thickness, extremely dense, and oxidation resistant. It is superior to nitride formed by chemical vapor deposition and has many potential advantages over oxides. This thermal nitride has been used as a gate dielectric for MOS VLSI devices, as a dielectric for floating gate EEPROMs with lower operating voltages and improved endurance and as a potential method for reducing the area of storage capacitors in dynamic RAMs.

In accordance with this invention, a substrate on which a layer of thermal nitride has been formed by direct nitridation is placed in electrolyte 21 and subjected to the voltage source 24, thus rupturing or modifying areas of the thermal nitride which exhibit insufficient dielectric strength. The wafer may then be subjected to an oxidation step, in which the damaged areas of thermal nitride are repaired by formation of oxide plugs. Alternatively, each defect in a thermal nitride layer may also be repaired by utilizing a second direct nitridation step, thus forming in each defect a nitride plug which is self limited at approximately seventy angstroms thickness.

The above method yields dielectrics which can be stressed to their breakdown value and thus which are capable of being used competitively in VLSI (very large scale integration) products which require such dielectrics. In such products, yield and reliability become extremely sensitive to latent pinholes and areas of lower breakdown voltage. The method is particularly applicable to volume production in that the fixture such as shown in FIG. 2 is capable of handling large numbers of wafers in a batch or lot in a manner quite similar to the cleaning processes now used in semiconductor device fabrication.

Other embodiments of this invention will be obvious in view of the above disclosure.

What is claimed is:

1. The method of detecting and repairing latent defects in a dielectric layer on a semiconductor substrate on which a circuit is to be formed which comprises:
    electrically stressing the dielectric layer prior to completion of the circuit to be formed on said substrate by applying a voltage across said layer of a voltage value substantially that to which the region of said dielectric layer not containing latent defects is capable of being subjected without damage so as to damage weak areas of said dielectric layer; and
    forming additional dielectric on those regions of the semiconductor substrate beneath the weak areas of dielectric damaged by said voltage prior to completion of the circuit to be formed on said substrate.

2. The method of claim 1 wherein said voltage stress value is greater than the maximum voltage to which said dielectric layer will be subjected in the operation of a finished product made using said substrate and said dielectric layer.

3. The method of claim 1 wherein said voltage stress value is equal to the maximum voltage to which said dielectric layer will be subjected in the operation of a finished product made using said substrate and said dielectric layer.

4. The method of claim 1 wherein said dielectric layer comprises a layer of oxide of silicon formed on a silicon substrate and a layer of silicon nitride formed on said layer of oxide.

5. The method of claim 4 wherein said additional dielectric comprises an oxide of silicon.

6. The method of claim 5 wherein said additional dielectric is oxide formed by thermal oxidation of said silicon substrate through defects in said dielectric layer formed by said voltage.

7. The method of claim 1 wherein said dielectric layer comprises a silicon nitride layer formed on a silicon substrate.

8. The method of claim 7 wherein said additional dielectric comprises an oxide of silicon.

9. The method of claim 7 wherein said additional dielectric comprises silicon nitride.

10. The method of claim 7 wherein said dielectric layer comprises silicon nitride formed by direct nitridation, and said additional dielectric comprises silicon nitride formed by direct nitridation.

11. The method of detecting and repairing latent defects in a dielectric layer on a semiconductor substrate which comprises:
    electrically stressing the dielectric layer by applying a voltage across said layer of a voltage value substantially that to which the region of said dielectric layer not containing latent defects is capable of being subjected without damage so as to damage weak areas of said dielectric layer; and
    forming additional dielectric on those regions of the semiconductor substrate beneath the weak areas of dielectric damaged by said voltage;
    wherein said voltage is applied to said dielectric layer on a semiconductor substrate by placing the substrate in an electrolyte bath, providing an electrode in the bath spaced from the substrate, said electrolyte being in intimate contact with said dielectric layer, and passing a voltage across said substrate to said electrode through said electrolyte to locally rupture the dielectric layer at said weak areas by exceeding the dielectric breakdown strength of said areas of the dielectric layer.

12. The method of claim 11 wherein said voltage is applied across the dielectric layer and electrode for a time sufficient to rupture time-dependent weak areas which may fail during the useful life of the product made from said substrate.

13. The method of claim 11 in which said additional dielectric is applied by subjecting said substrate to an oxygen atmosphere at elevated temperature to oxidize the silicon substrate.

14. The method of detecting and repairing latent defects in a dielectric layer on a semiconductor substrate which comprises:
    electrically stressing the dielectric layer by applying a voltage across said layer of a voltage value substantially that to which the region of said dielectric layer not containing latent defects is capable of being subjected without damage so as to damage weak areas of said dielectric layer; and
    forming additional dielectric on those regions of the semiconductor substrate beneath the weak areas of dielectric damaged by said voltage;
    wherein said voltage is applied to said layer by an alternating current or pulsed direct current passing through a liquid electrolyte into which said substrate is placed.

* * * * *